(12) United States Patent
Kodama et al.

(10) Patent No.: US 8,259,528 B2
(45) Date of Patent: Sep. 4, 2012

(54) SEMICONDUCTOR MEMORY DEVICE AND A METHOD OF CONTROLLING A SEMICONDUCTOR MEMORY DEVICE

(75) Inventors: Noriaki Kodama, Kanagawa (JP); Takuji Onuma, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 11 days.

(21) Appl. No.: 12/892,462

(22) Filed: Sep. 28, 2010

(65) Prior Publication Data
US 2011/0075500 A1    Mar. 31, 2011

(30) Foreign Application Priority Data
Sep. 29, 2009  (JP) .................................. 2009-224896

(51) Int. Cl.
*G11C 17/18*    (2006.01)

(52) U.S. Cl. ...................................... 365/225.7; 365/96
(58) Field of Classification Search ............... 365/225.7, 365/96
See application file for complete search history.

(56) References Cited

U.S. PATENT DOCUMENTS 6,628,561 B2 *   9/2003   Van De Graaff ........... 365/225.7
2009/0250726 A1 * 10/2009  Kurjanowicz ................. 257/209

FOREIGN PATENT DOCUMENTS
JP    2007-080302 A    3/2007
* cited by examiner

*Primary Examiner* — Huan Hoang
(74) *Attorney, Agent, or Firm* — Sughrue Mion, PLLC

(57) ABSTRACT

A semiconductor memory device includes a first anti-fuse element and a second anti-fuse element, respectively composed of a transistor, wherein the first anti-fuse element and the second anti-fuse element are configured so as to be concomitantly programmable, respectively formed in P-wells on a substrate, and the adjacent P-wells are isolated by N-wells of an opposite conductivity type, formed therebetween.

19 Claims, 6 Drawing Sheets

SEMICONDUCTOR MEMORY DEVICE AND A METHOD OF CONTROLLING A SEMICONDUCTOR MEMORY DEVICE

This application is based on Japanese patent application No. 2009-224896 the content of which is incorporated hereinto by reference.

BACKGROUND

1. Technical Field

The present invention relates to a semiconductor memory device and a method of controlling a semiconductor memory device, and in particular to a semiconductor memory device which contains anti-fuse elements, and a method of controlling such semiconductor memory device.

2. Background Art

In these years, anti-fuse memory making use of anti-fuse elements typically composed of transistors and so forth has been known. Write-in operation (programming) into the anti-fuse memory is accomplished by causing breakdown of a gate insulating film in each anti-fuse element, to thereby electrically connect a gate electrode and an impurity-diffused region formed in a surficial portion of a substrate.

It has, however, been difficult to exactly judge a program status of the anti-fuse element, due to variation in the processes and variation in current after breakdown of the anti-fuse element.

Japanese Laid-Open Patent Publication No. 2007-080302 describes a semiconductor integrated circuit which includes a first and second anti-fuse elements commonly connected at one ends thereof with each other; a first and second transistors for program selection, which are connected to the other ends of the first and second anti-fuse elements; a switching element connected between one ends of the first and second transistor for program selection; and a sense amplifier circuit connected at one end to the switching element, so as to detect data read out from the first and second anti-fuse elements. By virtue of this configuration, two anti-fuse elements concomitantly operate during readout, so that a sufficient level of readout current may be ensured if both of the anti-fuse elements are broken down. According to the description, the breakdown/non-breakdown status may consequently be judged in a stable manner, without being affected by variation in the current due to variations in the process or variations in current after the anti-fuse elements are broken down.

SUMMARY

According to the technique described in Japanese Laid-Open Patent Publication No. 2007-080302, in the process of programming by which the anti-fuse elements are broken down and electrically connected, the first and second anti-fuse elements are selected one by one, and the selected anti-fuse element is sequentially broken down. The programming therefore takes a long time, and undesirably raises a cost for testing.

The present inventors then discussed concomitant programming of a plurality of anti-fuse elements, to find the following problem. The anti-fuse memory is typically configured to have a memory cell array structure having a plurality of memory cells arrayed therein to form a matrix. Each memory cell contains a single anti-fuse element, and a selection transistor as a switch for selecting the anti-fuse element. In this configuration, an effort of concomitantly breaking a plurality of anti-fuse elements may fail in applying a desired level of programming voltage to the selected cells, due to potential drop induced by program current.

The status in this case will be explained referring to FIG. 7.

FIG. 7 illustrates a configuration having a plurality of anti-fuse elements formed on a substrate (P-sub). For the case where the plurality of anti-fuse elements are concomitantly selected and programmed, a programming voltage (6.5 V) is applied to the gate electrode of each anti-fuse elements. In this process, the anti-fuse elements internally causing breakdown generate hot carriers in the channels between sites of breakdown of the gate insulating film and the source (W), and holes are injected from the anti-fuse elements to the substrate. For this reason, an attempt to induce breakdown in a plurality of anti-fuse elements at a time will result in a large increase in the substrate potential due to the holes injected into the substrate. As a consequence, difference in potential between the gate electrodes and the substrate will be reduced in other anti-fuse elements not yet causing breakdown therein, enough to fail in applying a desired level of programming voltage, and thereby the breakdown may occasionally proceed unsuccessfully. As described in the above, it has been difficult for the technique shown in FIG. 7 to concomitantly program a plurality of anti-fuse elements.

According to the present invention, there is provided a semiconductor memory device comprising a substrate, a first region formed in a surficial portion of the substrate, a second region formed in a surficial portion of the substrate, a first anti-fuse element formed in the first region, a second anti-fuse element formed in the second region and a third region formed between the first region and the second region in a surficial portion of the substrate so as to isolate the first region and the second region, wherein the first region and the second region have a first conductive type, each of the first anti-fuse element and the second anti-fuse element is composed of a transistor, the third region has a second conductive type opposite to the first conductive type, and the first anti-fuse element and the second anti-fuse element are configured so as to be concomitantly programmable.

According to the present invention, there is provided a method of controlling a semiconductor memory device for controlling a semiconductor memory device which includes a first anti-fuse element and a second anti-fuse element, each of which is composed of a transistor, and is formed respectively in a first region and a second region of a first conductivity type on a substrate; and a third region of a second conductivity type, opposite to the first conductivity type, formed between the first region and the second region so as to isolate the first region and the second region.

The method includes a step of concomitantly programming the first anti-fuse element and the second anti-fuse element.

As has been described in the above referring to FIG. 7, when a programming voltage is applied in the process of programming to the gate electrodes of a plurality of anti-fuse elements, a relatively large substrate current may flow due to holes, and thereby the substrate potential may fluctuate. In this situation, increase in the number of memory cells to be concomitantly programmed may undesirably increase the substrate current.

In contrast, according to the configuration of the present invention, the first-conductivity-type first region and the second region, respectively having the first anti-fuse element and the second anti-fuse element to be concomitantly programmed formed therein, are isolated by the second-conductivity-type third region having the different conductivity type. Accordingly, for example, even if the gate insulating film causes breakdown in the first anti-fuse element to produce hot carriers, and the holes are consequently injected from the first anti-fuse element to the first region, the second region may successfully be prevented from elevating in the potential. Also the first region may be prevented from elevating in the potential due to influences by the second anti-fuse elements. Accordingly, each anti-fuse element may keep a desirable level of difference of potential between the gate electrode and the substrate, without being affected by the other anti-fuse element, so that each anti-fuse element may be applied with a desired level of programming voltage, and thereby the plurality of anti-fuse elements may successfully be programmed at a time. As a consequence, a substantial time of programming and costs for testing may be reduced.

Note that all arbitrary combinations of the above-described constituents, and all exchanges of expressions of the present invention made among methods, devices and so forth, may be effective as embodiments of the present invention.

According to the present invention, a plurality of anti-fuse elements may be programmed at a time, and thereby the process time may be reduced.

BRIEF DESCRIPTION OF THE DRAWINGS

The above and other objects, advantages and features of the present invention will be more apparent from the following description of a certain preferred embodiment taken in conjunction with the accompanying drawings, in which.

DETAILED DESCRIPTION

Figure 1:
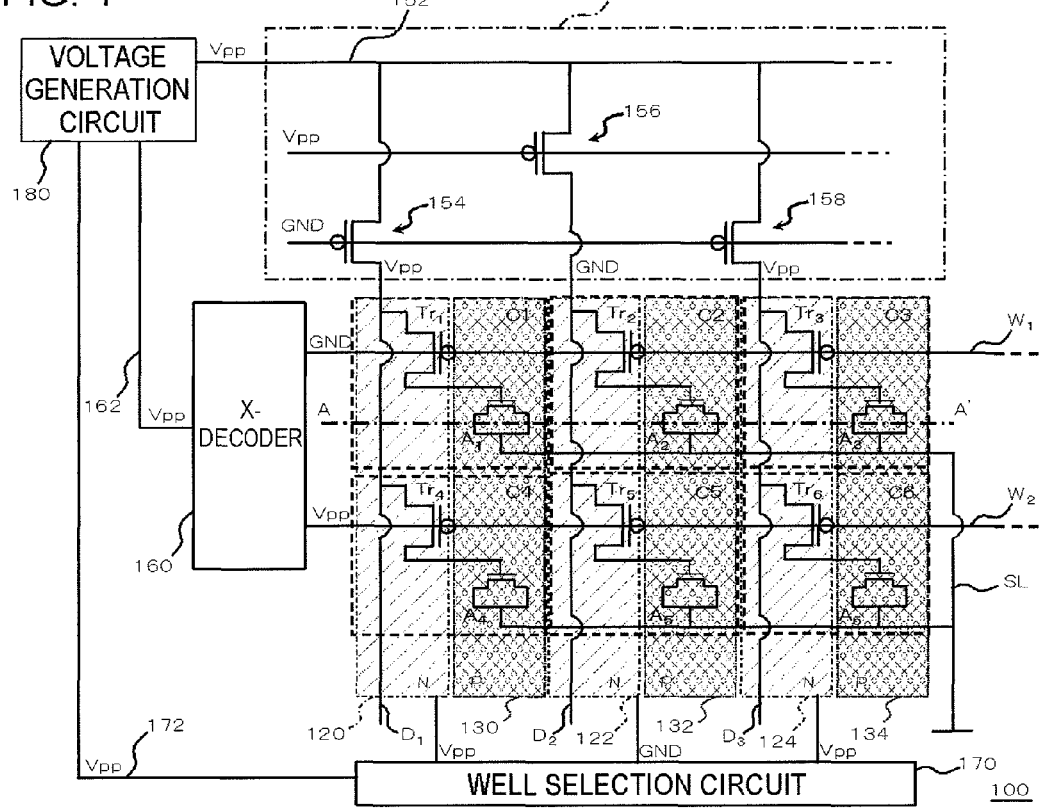
FIG. 1 is a circuit diagram illustrating an exemplary configuration of a semiconductor memory device in an embodiment of the present invention.

The invention will now be described herein with reference to an illustrative embodiment. Those skilled in the art will recognize that many alternative embodiments can be accomplished using the teachings of the present invention and that the invention is not limited to the embodiments illustrated for explanatory purposes.

Embodiment of the present invention will be explained below, referring to the attached drawings. Note that all similar constituents in all drawings will be given similar reference numerals or symbols, and explanations therefor will not always be repeated.

Figure 2:
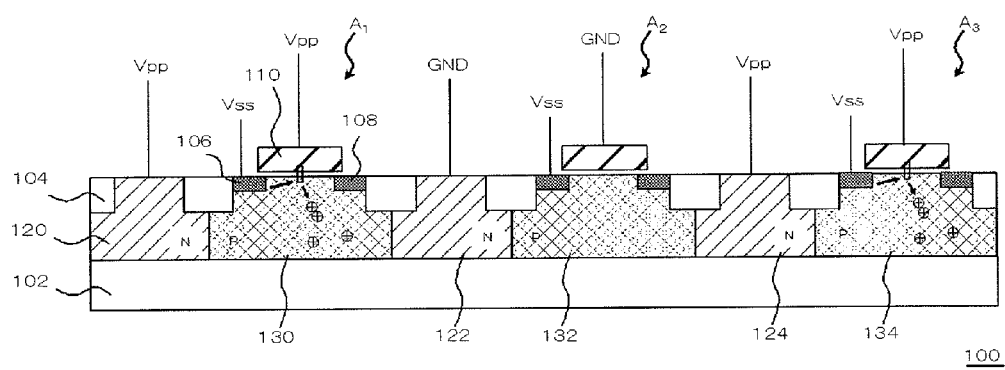
FIG. 2 is a sectional view illustrating an exemplary configuration of a semiconductor memory device in an embodiment of the present invention.

FIG. 1 is a circuit diagram illustrating an exemplary configuration of a semiconductor memory device of an embodiment of the present invention. FIG. 2 is a sectional view illustrating a layout which appears at a cross section taken along line A-A' in FIG. 1. FIG. 1 and FIG. 2 illustrate a status of programming carried out by applying a predetermined level of programming voltage to the anti-fuse elements.

A semiconductor memory device 100 of this embodiment includes a substrate 102 having a first-conductivity-type region and a second-conductivity-type region formed in the surficial portion thereof. In this embodiment, in the surficial portion of the substrate 102, first-conductivity-type wells and second-conductivity-type wells, respectively extending in the direction of gate width, are alternately arranged so as to form a stripe pattern. More specifically, in the surficial portion of the substrate 102, an N-well 120, a P-well 130, an N-well 122, a P-well 132, an N-well 124, and a P-well 134 are formed in this order. Note that, the first conductivity type and the second conductivity type, respectively defined as P type and N type in this embodiment, may be exchanged in other embodiments. The substrate 102 may typically be configured by a semiconductor substrate such as silicon substrate. The substrate 102 may be P type, for example.

In this embodiment, the semiconductor memory device 100 contains a memory cell array having a plurality of memory cells arrayed therein to form a matrix, wherein each memory cell contains an anti-fuse element configured by a transistor, and a selection transistor connected to the anti-fuse element and functions as a switch for selecting the anti-fuse element. The memory cells are formed on the substrate 102.

In FIG. 1, the lateral direction of the drawing is defined as x-direction, and the vertical direction is defined as y-direction. Now, in the x-direction, a memory cell C1, a memory cell C2 and a memory cell C3 are arranged. Below the memory cell C1, the memory cell C2, and the memory cell C3, and in parallel therewith in the x-direction, a memory cell C4, a memory cell C5 and a memory cell C6 are arranged. In other words, the individual pairs of the memory cell C1 and the memory cell C4; the memory cell C2 and the memory cell C5; and the memory cell C3 and the memory cell C6 are arranged in adjacent to each other in the y-direction. Note that, while the drawings herein illustrate only six memory cells, the semiconductor memory device 100 may contain a larger number of memory cells.

For example, the memory cell C1 contains an anti-fuse element $A_1$, and a selection transistor $Tr_1$ connected to the anti-fuse element $A_1$. Also the memory cells C2 to C6 are configured similarly to the memory cell C1, and respectively contain anti-fuse elements $A_2$ to $A_6$, and the selection transistors $Tr_2$ to $Tr_6$.

Either ones of sources and drains of the selection transistor $Tr_1$ and the selection transistor $Tr_4$, respectively contained in the memory cell C1 and the memory cell C4 formed in the same column in the y-direction, are connected to a same digit line $D_1$. Similarly, either ones of sources and drains of the selection transistor $Tr_2$ and selection transistor $Tr_5$, respectively contained in the memory cell C2 and the memory cell C5 formed in the same column in the y-direction, are connected to a same digit line $D_2$. Again similarly, either ones of sources and drains of the selection transistor $Tr_1$ and selection transistor $Tr_6$, respectively contained in the memory cell C3 and the memory cell C6 formed in the same column in the y-direction, are connected to a same digit line $D_3$.

The other ones of sources and drains of the selection transistors are connected to the correspondent gate electrodes of the anti-fuse elements.

On the other hand, the gate electrodes of the selection transistor $Tr_1$, the selection transistor $Tr_2$ and the selection transistor $Tr_3$, respectively contained in the memory cell C1, the memory cell C2 and the memory cell C3 formed in the same line in the x-direction, are connected to a same word line $W_1$. Similarly, the gate electrodes of the selection transistor $Tr_4$, the selection transistor $Tr_5$ and the selection transistor $Tr_6$, respectively contained in the memory cell C4, the memory cell C5 and the memory cell C6 formed in the same line in the x-direction, are connected to a same word line $W_2$.

In the individual memory cells, the anti-fuse elements are formed in the P-wells (first-conductivity-type regions) in the surficial portion of the substrate 102. In this embodiment, each anti-fuse element in each memory cell may be configured by an N-type transistor (NMOS). The gate insulating film of the anti-fuse elements may be configured thinner than that of general transistors such as selection transistors. By virtue of this configuration, the gate insulating film may cause breakdown when a predetermined level of programming voltage is applied to the gate electrodes 110 of the anti-fuse elements, thereby the gate electrodes establish electrical connection with the sources or drains and the anti-fuse elements are programmed. In the process of programming, a predetermined level of voltage Vss is applied to either ones of the sources and drains (drains 106 in this example) of the anti-fuse elements. The other ones (sources 108 in this example) of the sources and drains of the plurality of anti-fuse elements are connected to a source line SL.

On the other hand, in this embodiment, the selection transistors may be configured as transistors having a conductivity type opposite to that of the anti-fuse elements. In this embodiment, each selection transistor of each memory cell is formed in the N-well (second-conductivity-type region) in the surficial portion of the substrate 102. In this embodiment, the selection transistors ($Tr_1$ to $Tr_6$) of the individual memory cells may be configured by P-type transistors (PMOS).

In this embodiment, the anti-fuse element $A_1$ and the anti-fuse element $A_4$ are formed in the same P-well 130. Similarly, the anti-fuse element $A_2$ and the anti-fuse element $A_5$ are formed in the P-well 132; and the anti-fuse element $A_3$ and the anti-fuse element $A_6$ are formed in the P-well 134. The selection transistor $Tr_1$ and the selection transistor $Tr_4$ are formed on the N-well 120; the selection transistor $Tr_2$ and the selection transistor $Tr_5$ are formed on the N-well 122; and the selection transistor $Tr_3$ and the selection transistor $Tr_6$ are formed on the N-well 124.

While not illustrated in FIG. 1, every adjacent P-well and N-well are partitioned by a device isolation insulating film 104 (see FIG. 2). In FIG. 2, the selection transistor $Tr_1$, the selection transistor $Tr_2$, and the selection transistor $Tr_3$ are not illustrated.

In this embodiment, the semiconductor memory device 100 is configured to allow concomitant programming of a plurality of anti-fuse elements formed in the separate P-wells individually isolated by the N-well placed in between. In this embodiment, the semiconductor memory device 100 is configured so as to allow concomitant programming of the anti-fuse element $A_1$ (first anti-fuse element) and the anti-fuse element $A_3$ (second anti-fuse element). In this embodiment, the semiconductor device 100 is configured so that the selection transistor $Tr_1$ (first selection transistor) and the selection transistor $Tr_3$ (second selection transistor) are concomitantly turned on, and thereby the anti-fuse element $A_1$ and the anti-fuse element $A_3$ are turned concomitantly programmable. In the illustrated example, the plurality of anti-fuse elements ($A_1$, $A_3$), which are controlled through the same word line ($W_1$) and connected to different digit lines ($D_1$, $D_3$), may concomitantly be programmable. As a consequence, the plurality of anti-fuse elements may concomitantly be programmable, depending on status of changeover of the voltage to be applied through the word line.

The configuration will more specifically be described. The explanation herein deals with a write operation (programming) of the anti-fuse elements.

The semiconductor memory device 100 includes a selection circuit configured so as to concomitantly turn on the gate electrode of the selection transistor $Tr_1$ and the gate electrode of the selection transistor $Tr_3$, to thereby concomitantly apply a predetermined level of programming voltage to the gate electrode of the anti-fuse element $A_1$ and the gate electrode of the anti-fuse element $A_3$. The selection circuit is configured to apply, through the word line $W_1$, a predetermined level of voltage for turning on the selection transistor $Tr_1$ and the selection transistor $Tr_3$, and also to apply a predetermined level of voltage, through the digit line $D_1$ (first digit line) and the digit line $D_3$ (second digit line), so that a predetermined level of programming voltage may concomitantly be applied to the gate electrode of the anti-fuse element $A_1$ and the gate electrode of the anti-fuse element $A_3$.

In this embodiment, the selection circuit may be configured by a Y-selection circuit 150, an X-decoder 160, a well selection circuit 170, and a voltage generation circuit 180.

The voltage generation circuit 180 generates a predetermined level of programming voltage Vpp, and supplies the programming voltage Vpp respectively through a voltage feedline 152, voltage feedline 162, and a voltage feedline 172, to the Y-selection circuit 150, the X-decoder 160, and the well selection circuit 170.

The Y-selection circuit 150 applies the programming voltage Vpp or ground voltage GND to the individual digit lines which extend in the y-direction. In this embodiment, the Y-selection circuit 150 contains y-switches for selecting the digit lines to be applied with the programming voltage Vpp. The y-switches are respectively provided to the individual digit lines. Each y-switch herein may be configured by a transistor.

More specifically, the Y-selection circuit 150 contains a digit line selection transistor 154 connected to one end of the digit line $D_1$, a digit line selection transistor 156 connected to one end of the digit line $D_2$, and a digit line selection transistor 158 connected to one end of the digit line $D_3$. In one embodiment, each of the digit line selection transistors (154, 156, 158) may be configured by a P-type transistor (PMOS). By virtue of this configuration, the digit line selection transistors may function also as load resistors in the process of programming of the anti-fuse elements. Accordingly, by adjusting the resistivity over each path from the voltage generation circuit 180, which is a source of the programming voltage Vpp, to each digit line selection transistor to a sufficiently low level potential drop over each path from the voltage generation circuit 180 to each digit line selection transistor due to the program current may be suppressed, even if the programming voltage is concomitantly applied to the plurality of digit lines.

In the Y-selection circuit 150 configured as described in the above, one ends of the sources and drains of the digit line selection transistors 154, 156 and 158 are applied with the programming voltage Vpp supplied from the voltage generation circuit 180. The individual digit line selection transistors 154, 156 and 158 are turned on upon application of the ground voltage GND to the gate electrodes. The other ends of the sources/drains of the digit line selection transistors 154, 156 and 158 thus turned on are applied with the programming voltage Vpp through the digit lines. On the other hand, when the digit line selection transistors 154, 156 and 158 are turned off, the sources and drains of the digit line selection transistor are applied, through the digit lines connected thereto, with the ground voltage GND.

The X-decoder 160 supplies the programming voltage Vpp or the ground voltage GND to the word line which extend in the x-direction. While not illustrated herein, the X-decoder 160 contains x-switches for selecting the selection transistors aligned in the individual lines in the x-direction. The x-switches are respectively provided to the individual word lines one by one. Each x-switch herein may be configured by a transistor. The transistors herein may be N-type or P-type. The X-decoder 160 applies the ground voltage GND to the word lines in the x-direction which contain the memory cells to be programmed, so as to turn on the correspondent selection transistors. The X-decoder 160 also applies the programming voltage Vpp through the word lines in the x-direction, which contain no memory cells to be programmed.

The well selection circuit 170 applies the programming voltage Vpp or the ground voltage GND to the individual N-wells 120 to 124. While not illustrated herein, the well selection circuit 170 contains switches for selecting which of the programming voltage Vpp and the ground voltage GND is applied to the individual N-wells 120 to 124. The switches are respectively provided to the N-wells one by one. Each switch may be configured by a transistor. The transistors herein may be N-type or P-type. The well selection circuit 170 applies the programming voltage Vpp to the N-wells which contain the memory cells to be programmed. On the other hand, the well selection circuit 170 applies the ground voltage GND to the N-wells which do not contain memory cells to be programmed.

A mechanism of concomitant programming of the anti-fuse element $A_1$ of the memory cell C1 and anti-fuse element $A_3$ of the memory cell C3 in the thus-configured semiconductor memory device 100, while a predetermined level of programming voltage Vpp is applied to the anti-fuse element $A_1$ and to the anti-fuse element $A_3$, will be explained below. FIG. 1 and FIG. 2 are drawings illustrating a relevant status.

The Y-selection circuit 150 preliminarily applies a predetermined level of programming voltage Vpp to the digit line $D_1$ and the digit line $D_3$ respectively connected to the selection transistor $Tr_1$ and the selection transistor $Tr_1$ to be selected. The Y-selection circuit 150 also preliminarily applies the ground voltage GND to the digit lines (including the digit line $D_2$) to which no selection transistor to be selected is connected.

More specifically, a predetermined level of programming voltage Vpp is preliminarily applied to either ones of the sources and drains (the sides opposite to those on which the digit line selection transistors are connected to the digit lines) of the individual digit line selection transistors 154, 156 and 158.

In this status, to the gate electrodes of the digit line selection transistors 154 and 158, the ground voltage GND for turning on these transistors is applied. On the other hand, to the gate electrodes of the digit line selection transistors (including the digit line selection transistor 156) connected to the digit lines (including the digit line $D_2$) having no selection transistors to be selected connected thereto, the programming voltage Vpp is applied. As a consequence, the programming voltage Vpp is applied to the gate electrodes, and thereby the digit line selection transistors such as digit line selection transistor 156 remain turned off. Note that, while the description herein dealt with an exemplary configuration where a common gate electrode is connected to the digit line selection transistors 154 and 158, another allowable configuration may be such as providing a gate electrode to each of the digit line selection transistors 154 and 158, and the ground voltage GND is applied to both gate electrodes so as to concomitantly turn on the transistors.

By the operations described in the above, the programming voltage Vpp is applied to the digit line $D_1$ and the digit line $D_3$, and the ground voltage GND is applied to the other digit lines including the digit line $D_2$. The X-decoder 160 in this stage is configured to apply the programming voltage Vpp to all word lines. As a consequence, none of the selection transistors are kept turned on, and none of the anti-fuse elements are kept programmed.

The well selection circuit 170 preliminarily applies a predetermined level of programming voltage Vpp respectively to the N-well 120 and the N-well 124 in which the selection transistors $Tr_1$ and $Tr_3$ to be selected are formed. On the other hand, the N-well 122, in which the selection transistor formed therein is not selected, is applied with the ground voltage GND. In this way, electrical isolation between the P-well 130 and the P-well 134 may successfully be ensured as described later.

In this status, the X-decoder 160 selectively applies the ground voltage GND only to the word line $W_1$ to which the selection transistor $Tr_1$ and the selection transistor $Tr_3$ to be selected are connected. Accordingly, only the selection transistors having the gate electrodes connected to the word line $W_1$, are turned on. Since the digit line $D_1$ and the digit line $D_3$ are applied with the programming voltage Vpp, so that the gate electrodes of the anti-fuse element $A_1$ and the anti-fuse element $A_3$ are applied with the programming voltage Vpp, and thereby the gate insulating films of the elements cause breakdown. In this way, the gate electrodes of the anti-fuse element $A_1$ and the anti-fuse element $A_3$ establish electrical connection with the sources or drains, and are therefore programmed.

While also the selection transistor $Tr_2$ in this process turns on, but the digit line $D_2$ is applied with the ground voltage GND, so that the gate electrode of the anti-fuse element $A_2$ is applied with the ground voltage GND, and thereby the anti-fuse element $A_2$ is not programmed. By the operations described in the above, desired ones of the plurality of anti-fuse elements may selectively be programmed at a time. The programming (write-in operation) of the anti-fuse elements thus completes.

Next, effects of the semiconductor memory device 100 of this embodiment will be explained.

Figure 7:
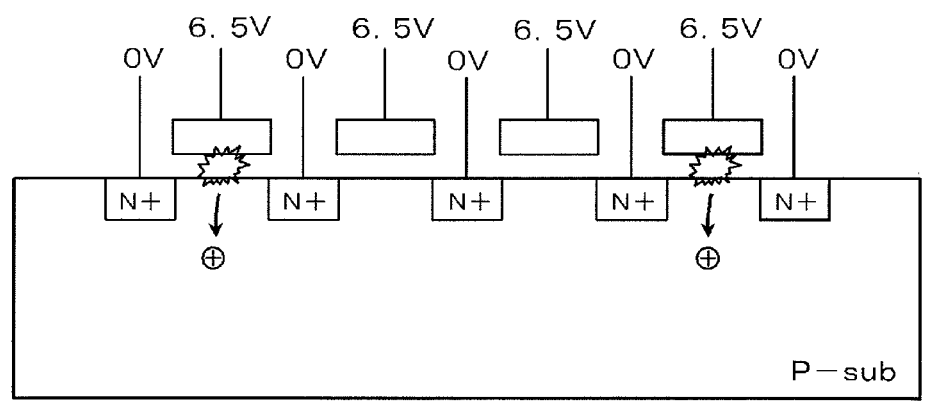
FIG. 7 is a drawing illustrating a problem to be solved in concomitant programming of a plurality of anti-fuse elements.

The description below will be given referring also to FIG. 2. As has been described in the above referring to FIG. 7, when the programming voltage Vpp is applied to the gate electrode of the plurality of anti-fuse elements in the process of programming, a relatively large substrate current flows due to holes, and potential of the P-wells fluctuate. Now, increase in the number of memory cells to be concomitantly programmed may increase the substrate current.

In contrast, in this embodiment, the anti-fuse elements to be concomitantly programmed are isolated from each other by the N-wells (the N-well 122 and the N-well 124 in this case) of the different conductivity type, and thereby the P-well 130 and the P-well 134 are electrically isolated. Accordingly, even if, for example, the gate insulating film causes breakdown in the anti-fuse element $A_1$ to produce hot carriers, and thereby the holes are injected from the anti-fuse element $A_1$ to the P-well 130, the P-well 134 may successfully be prevented from elevating in the potential. Also elevation in the potential of the P-well 130, otherwise possibly induced by the anti-fuse element $A_3$, may be avoidable. As a consequence, each anti-fuse element may keep the potential between the gate electrode and the substrate (P-well) at a desired level without being affected by the other anti-fuse elements, so that the anti-fuse elements may be applied with a desired level of programming voltage, and thereby the plurality of anti-fuse element may successfully be programmed at a time. In this way, a substantial time of programming and costs for testing may be reduced.

In addition, in this embodiment, there is a memory cell C2, which will not be programmed, formed between the memory cell C1 and the memory cell C3 which contain the anti-fuse element $A_1$ and the anti-fuse element $A_3$ to be programmed at a time, wherein the ground voltage GND is applied to the N-well 122 of the memory cell C2. In other words, between the P-well 130 and the P-well 134 having the anti-fuse element $A_1$ and the anti-fuse element $A_3$ respectively formed therein, the N-well 122 of the opposite conductivity type, applied with the ground voltage GND, is formed. Accordingly, a better level of electrical isolation between the P-well 130 and the P-well 134 may be ensured.

Figure 6:
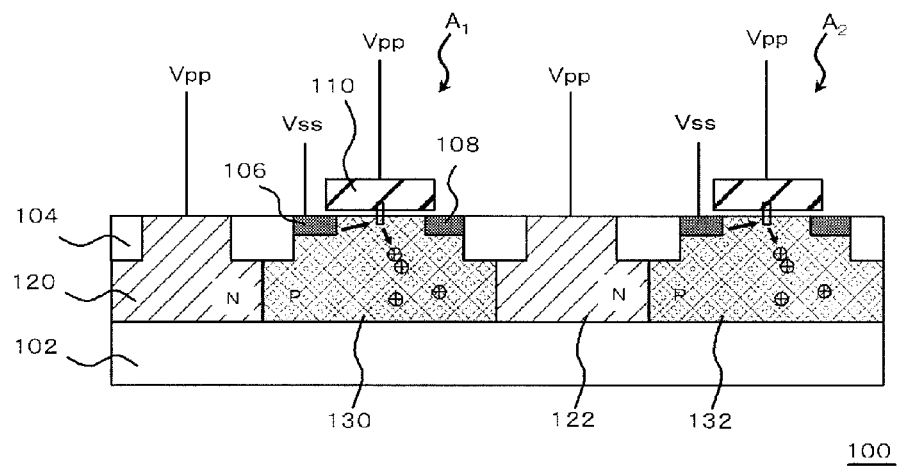
FIG. 6 is a sectional view illustrating still another exemplary configuration of a semiconductor memory device in an embodiment of the present invention.

While this embodiment explained an exemplary case where the anti-fuse elements in the memory cell C1 and the memory cell C3, isolated by the memory cell C2 provided in between, are concomitantly programmed, another possible configuration may be such as concomitantly programming the memory cell C1 and the memory cell C2. The configuration is illustrated in FIG. 6. Also in this case, as illustrated in FIG. 6, the P-well 130 and the P-well 132 in which the anti-fuse element $A_1$ and the anti-fuse element $A_2$ to be concomitantly programmed are formed, are isolated by the N-well 122, so that elevation in the potential in one P-well having the anti-fuse element formed therein, while being possibly affected by the other anti-fuse element, may be avoidable, and thereby a successful programming may be ensured.

Note that, in the configuration allowing concomitant programming of the memory cell C1 and the memory cell C2 adjacent to each other, the Y-selection circuit 150 may be configured differently from that illustrated in FIG. 1, in which a common gate electrode is connected to the digit line selection transistor 154 and the digit line selection transistor 156. Also this case allows another configuration in which a gate electrode is respectively provided to each of the digit line selection transistor 154 and the digit line selection transistor 156, and the ground voltage GND is applied to both gate electrodes so as to concomitantly turn them on.

Next, a method of reading out a program state of the anti-fuse element in the semiconductor memory device 100 of this embodiment will be explained.

Figure 3:
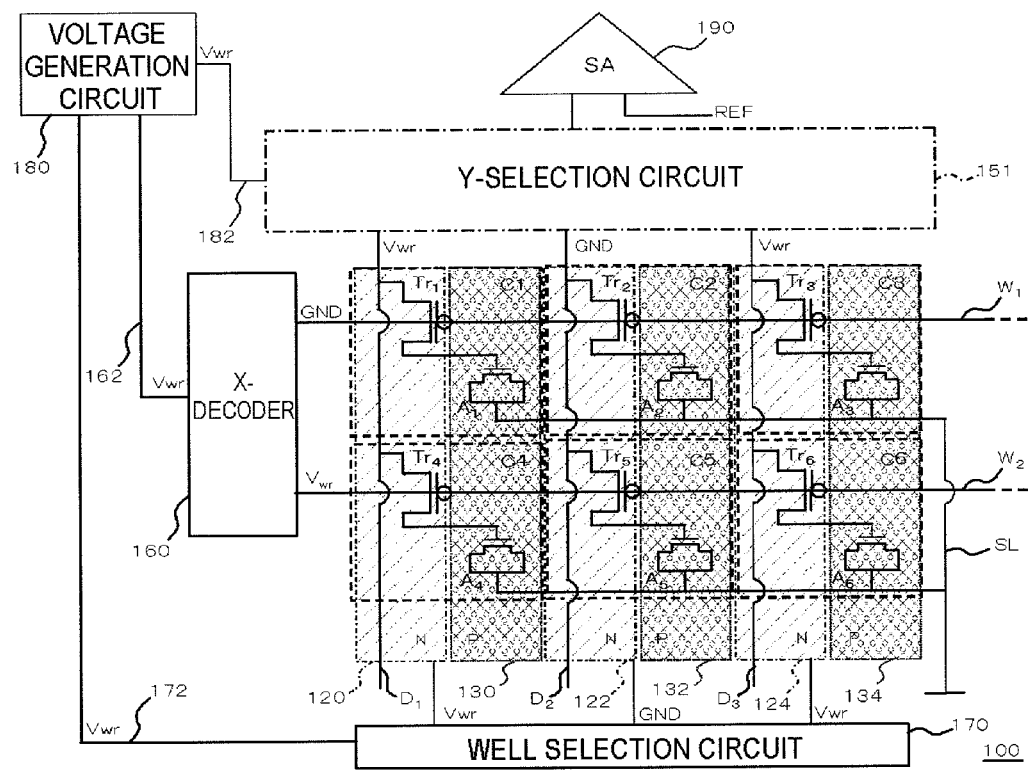
FIG. 3 is a circuit diagram illustrating another exemplary configuration of a semiconductor memory device in an embodiment of the present invention.

FIG. 3 is a drawing illustrating a status of the anti-fuse elements in the process of reading a program status out therefrom.

The semiconductor memory device 100 in this embodiment has a readout circuit which concomitantly reads out the program status of the plurality of anti-fuse elements concomitantly programmed as described in the above.

The readout circuit in this embodiment may be configured by a Y-selection circuit 151, an X-decoder 160, a well selection circuit 170, and a voltage generation circuit 180.

The voltage generation circuit 180 herein generates a predetermined level of readout voltage Vwr, and supplies it respectively through a voltage feedline 182, the voltage feedline 162, and the voltage feedline 172, respectively to the Y-selection circuit 151, the X-decoder 160, and the well selection circuit 170. The X-decoder 160 and the well selection circuit 170 may be configured similarly to as explained referring to FIG. 1, except that the voltage applied thereto from the voltage generation circuit 180 is changed from the programming voltage Vpp to the readout voltage Vwr.

The Y-selection circuit 151 applies the readout voltage Vwr or the ground voltage GND to the individual digit lines which extend in the y-direction. In this embodiment, the Y-selection circuit 151 includes y-switches for selecting the digit lines to be applied with the readout voltage Vwr. The y-switches are respectively provided to the individual digit lines one by one. Each y-switch herein may be configured by a transistor. The y-switches of the Y-selection circuit 151 may be configured by P-type transistors similarly to the y-switches of the Y-selection circuit 150, but may alternatively be configured by N-type transistors.

A mechanism of concomitant readout of the program status of the anti-fuse element $A_1$ of the memory cell C1 and anti-fuse element $A_3$ of the memory cell C3 in the thus-configured semiconductor memory device 100, while a predetermined level of readout voltage Vwr is applied to the anti-fuse element $A_1$ and the anti-fuse element $A_3$, will be explained below. FIG. 3 is a drawing illustrating a relevant status.

The Y-selection circuit 151 preliminarily applies a predetermined level of readout voltage Vwr to the digit line $D_1$ and the digit line $D_3$ respectively connected to the selection transistor $Tr_1$ and the selection transistor $Tr_1$ to be selected. On the other hand, the Y-selection circuit 151 preliminarily applies the ground voltage GND to the digit lines (including the digit line $D_2$) to which the selection transistors to be selected are not connected. Note that, up to this stage, the X-decoder 160 is configured to apply the readout voltage Vwr to all word lines. Accordingly, none of the selection transistors are turned on, and thereby all anti-fuse elements are remained unread.

The well selection circuit 170 also preliminarily applies the readout voltage Vwr respectively to the N-well 120 and the N-well 124 in which the selection transistor $Tr_1$ and the selection transistor $Tr_3$ to be selected are formed. The well selection circuit 170 also preliminarily applies the ground voltage GND to the N-well 122 in which the selection transistor formed therein is not selected.

In this state, the X-decoder 160 selectively applies the ground voltage GND only to the word line $W_1$ to which the selection transistor $Tr_1$ and the selection transistor $Tr_3$ to be selected are connected. Accordingly, only the selection transistors having the gate electrodes connected to the word line $W_1$, are turned on. Since the digit line $D_1$ and the digit line $D_3$ are applied with the readout voltage Vwr, so that the gate electrodes of the anti-fuse element $A_1$ and the anti-fuse element $A_3$ are applied with the readout voltage Vwr, and thereby the status of the anti-fuse elements may be read out.

While also the selection transistor $Tr_2$ in this process turns on, but the digit line $D_2$ is applied with the ground voltage GND, so that the gate electrode of the anti-fuse element $A_2$ is applied with the ground voltage GND, and thereby the anti-fuse element $A_2$ is not read out.

In this embodiment, the anti-fuse element $A_1$ and the anti-fuse element $A_3$ may configure a single anti-fuse for holding the program status.

Figure 4:
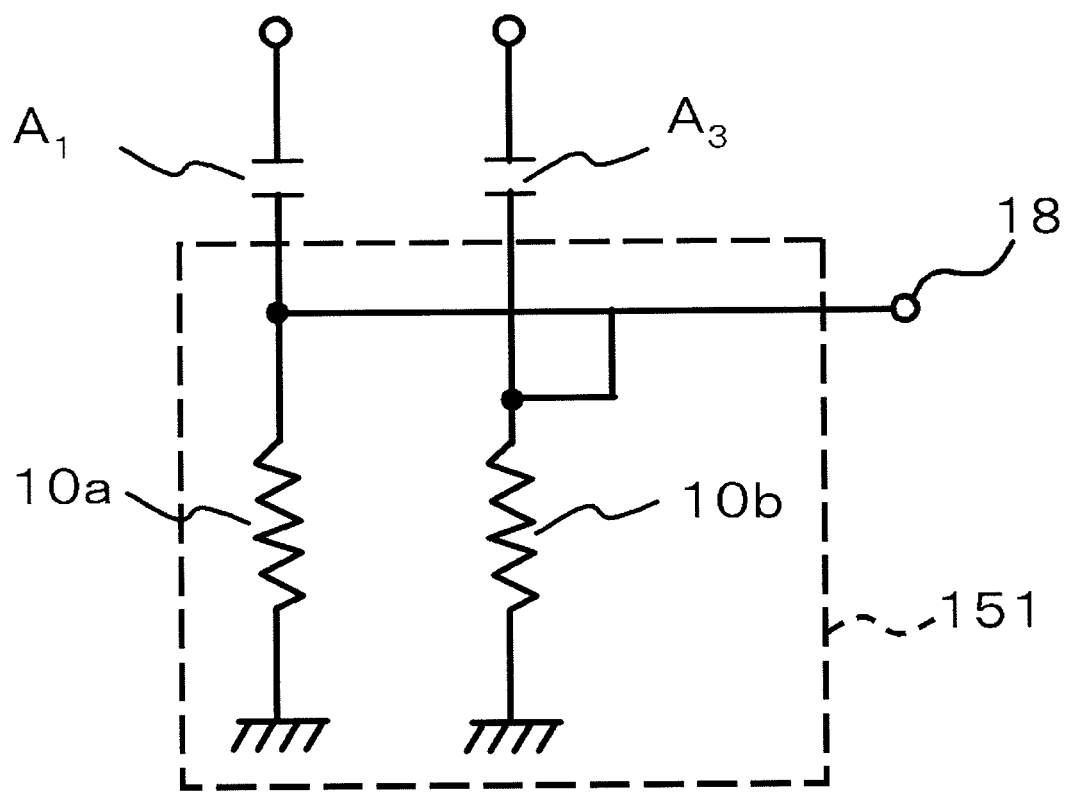
FIG. 4 is a drawing illustrating another exemplary circuit configuration containing anti-fuse elements in an embodiment of the present invention.

FIG. 4 is a drawing illustrating an exemplary circuit configuration which contains the anti-fuse element of this embodiment. The anti-fuse element $A_1$ and the anti-fuse element $A_3$ are respectively connected to a resistor 10a and a resistor 10b.

The circuit herein is configured so that a total value of current read out from the anti-fuse element $A_1$ and current read out from the anti-fuse element $A_3$ is output from an output section 18. The semiconductor memory device 100 in this embodiment may include a judging section (not illustrated) which judges the program status of the anti-fuses, based on the current output from the output section 18. A portion surrounded by a dot-dash line in FIG. 4 may be configured to be included in the Y-selection circuit 151, so that the output from the output section 18 may be input to a sense amplifier 190 illustrated in FIG. 3.

According to this configuration, since the program status of the anti-fuses may be judged based on the total value of the current read out from the plurality of anti-fuse elements, even if the output current from a single anti-fuse element is small and may be detectable only with difficulty, typically due to variations in the process or variation in the current after breakdown of the anti-fuse element, so that the program status may correctly be judged. For example, even if the current read out from one anti-fuse element after being programmed was found to be extremely small, due to some possible failure, the program status may correctly be judged so far as the read current falls in a certain allowable range.

Figure 5:
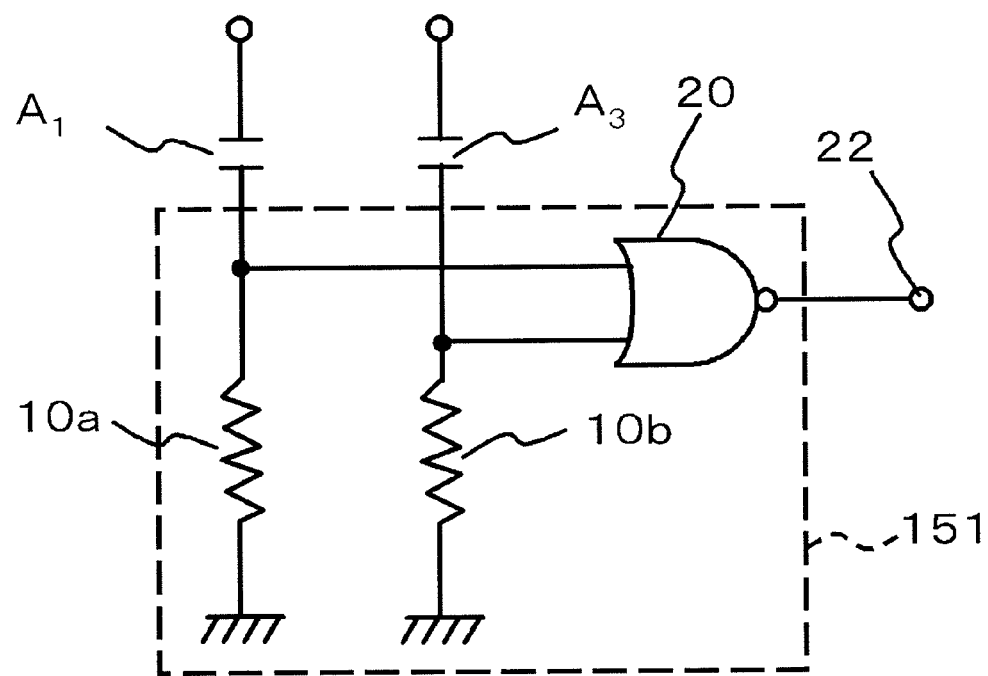
FIG. 5 is a drawing illustrating still another exemplary circuit configuration containing anti-fuse elements in an embodiment of the present invention.

FIG. 5 is a drawing illustrating another exemplary circuit configuration which contains the anti-fuse element of this embodiment. Also in this configuration, the anti-fuse element $A_1$ and the anti-fuse element $A_3$ may configure a single anti-fuse for holding the program status.

The circuit herein is configured so that a logical disjunction of current read out from the anti-fuse element $A_1$ and current read out from the anti-fuse element $A_3$ is output from an output section 18. In this embodiment, the semiconductor memory device 100 may include a NOR gate 20 to which the current read out from the anti-fuse element $A_1$ and the current read out from the anti-fuse element $A_3$ are input. An output from the NOR gate 20 is output from the output section 22. The semiconductor memory device 100 of this embodiment may include a judging section (not illustrated) which judges the program status of the anti-fuses, based on the current output from the output section 22. More specifically, the judging section in this configuration may judge connection of the anti-fuse, if at least either one of the anti-fuse element $A_1$ and the anti-fuse element $A_3$ is connected. A portion surrounded by a dot-dash line in FIG. 5 may be configured to be included in the Y-selection circuit 151, so that the output from the output section 22 may be input to a sense amplifier 190 illustrated in FIG. 3.

Accordingly, even if one anti-fuse element is not successfully programmed, typically due to variations in the processes, the status of "programmed" as a single anti-fuse may be judged if only the other anti-fuse element is successfully programmed at the same time, so that the program status may be judged in a highly precise manner.

As described in the above, the semiconductor memory device 100 may be configured so that the output from the output section 22 illustrated in FIG. 4 and the output from the output section 18 illustrated in FIG. 5 may be input to the sense amplifier 190. The judging section may judge the program status of the anti-fuses, based on the current output from the output section 22. Accordingly, the current may be increased to a level enough to ensure successful judgment.

The embodiments of the present invention have been described referring to the attached drawings, merely for the exemplary purposes, while allowing adoption of various configurations other than those described in the above.

Various configurations, other than those explained in the above, may be adoptable so far as a plurality of wells, in each of which the anti-fuse elements to be concomitantly programmed are formed, are isolated from each other by the wells of the opposite conductivity type. For example, while the embodiments in the above dealt with the cases where the selection transistor and the anti-fuse elements are configured by the transistors of different conductivity types, the transistors may alternatively have the same conductivity type.

Still alternatively, if there will be no problems in the operation, the well having the opposite conductivity type, formed between the wells in each of which the anti-fuse elements to be concomitantly programmed are formed, may be applied with the ground voltage. In this way, the electrical isolation between the wells in each of which the anti-fuse elements to be concomitantly programmed are formed, may be ensured in a successful manner.

What is claimed is:

1. A semiconductor memory device comprising:
   a substrate;
   a first region formed in a surficial portion of said substrate and having a first conductivity type;
   a second region formed in a surficial portion of said substrate and having said first conductivity type;
   a first anti-fuse element composed of a transistor and formed in said first region;
   a second anti-fuse element composed of a transistor and formed in said second region;
   a third region having a second conductivity type opposite to said first conductivity type and formed between said first region and said second region in a surficial portion of said substrate so as to isolate said first region and said second region; and
   a selection circuit configured to concomitantly program said first anti-fuse element and said second anti-fuse element.

2. The semiconductor memory device according to claim 1, further comprising:
   a first memory cell which contains said first anti-fuse element, and a first selection transistor connected to said first anti-fuse element so as to select said first anti-fuse element;
   a second memory cell which contains said second anti-fuse element, and a second selection transistor connected to said second anti-fuse element so as to select said second anti-fuse element; and
   the selection circuit configured to concomitantly turn on a gate electrode of said first selection transistor and a gate electrode of said second selection transistor, so as to concomitantly apply a predetermined level of programming voltage to said first anti-fuse element and said second anti-fuse element.

3. The semiconductor memory device according to claim 2, further comprising:
   a word line commonly connected to said gate electrode of said first selection transistor and said gate electrode of said second selection transistor;
   a first digit line connected to either one of source and drain of said first selection transistor; and
   a second digit line connected to either one of source and drain of said second selection transistor,
   the other one of the source and drain of said first selection transistor being connected to the gate electrode of said first anti-fuse element,
   the other one of the source and drain of said second selection transistor being connected to the gate electrode of said second anti-fuse element, and
   said selection circuit being configured to apply a first voltage of a predetermined level to said word line so as to turn on the gate electrode of said first selection transistor and the gate electrode of said second selection transistor, and to concomitantly apply a predetermined level of voltage to said first digit line and said second digit line, so that the predetermined level of programming voltage is concomitantly applied to the gate electrode of said first anti-fuse element and the gate electrode of said second anti-fuse element.

4. The semiconductor memory device according to claim 2, wherein said first selection transistor and said second selection transistor are respectively formed in a fourth region and a fifth region of the second conductivity type on said substrate, so as to have a conductivity type opposite to that of said first anti-fuse element and said second anti-fuse element, and at least either one of said fourth region and said fifth region is included in said third region.

5. The semiconductor memory device according to claim 4, further comprising:

a third memory cell which contains a third anti-fuse element formed between said first memory cell and said second memory cell in a sixth region of the first conductivity type; and a third selection transistor formed, in a seventh region of the second conductivity type, to have a conductivity type opposite to that of said third anti-fuse element, and connected to said third anti-fuse element so as to select said third anti-fuse element, said selection circuit being configured to apply a second voltage, at a potential different from that of said first voltage for turning on said first selection transistor and said second selection transistor, to said fourth region and said fifth region, and to apply said first voltage to said seventh region.

6. The semiconductor memory device according to claim 1, configured to apply a ground voltage to said third region.

7. The semiconductor memory device according to claim 1, further comprising:

a readout circuit which concomitantly read out a program status of said first anti-fuse element and a program status of said second anti-fuse element.

8. The semiconductor memory device according to claim 7, wherein said first anti-fuse element and said second anti-fuse element configure a single antifuse for holding a program status, and said readout circuit is configured to output a total value of current read out from said first anti-fuse element and current read from said second anti-fuse element.

9. The semiconductor memory device according to claim 7, wherein said first anti-fuse element and said second anti-fuse element configure a single antifuse for holding program status, and said readout circuit is configured to output a logical disjunction of current read out from said first anti-fuse element and current read out from said second anti-fuse element.

10. The semiconductor device according to claim 1, wherein an insulating film is formed between said first region and said third region in a surficial portion of said substrate.

11. The semiconductor device according to claim 1, wherein an insulating film is formed between said second region and said third region in a surficial portion of said substrate.

12. A method of controlling a semiconductor memory device for controlling a semiconductor memory device which comprises a first anti-fuse element and a second anti-fuse element, each of which is composed of a transistor, and is formed respectively in a first region and a second region of a first conductivity type on a substrate; and a third region of a second conductivity type, opposite to said first conductivity type, formed between said first region and said second region so as to isolate said first region and said second region, said method comprising:

concomitantly programming said first anti-fuse element and said second anti-fuse element, wherein said semiconductor memory device further comprises:

a first memory cell which contains said first anti-fuse element, and a first selection transistor connected to said first anti-fuse element so as to select said first anti-fuse element; and a second memory cell which contains said second anti-fuse element, and a second selection transistor connected to said second anti-fuse element so as to select said second anti-fuse element, in said concomitantly programming said first anti-fuse element and said second anti-fuse element, a gate electrode of said first selection transistor and a gate electrode of said second selection transistor are concomitantly turned on, and a predetermined level of programming voltage is concomitantly applied to a gate electrode of said first anti-fuse element and a gate electrode of said second anti-fuse element.

13. The method of controlling a semiconductor memory device according to claim 12, wherein in said semiconductor memory device, said first selection transistor and said second selection transistor are formed respectively in a fourth region and a fifth region of the second conductivity type on said substrate, said first anti-fuse element and said second anti-fuse element are formed to have the same conductivity type, and at least either one of said fourth region and said fifth region is contained in said third region.

14. The method of controlling a semiconductor memory device according to claim 13, wherein said semiconductor memory device further comprises a third memory cell which contains a third anti-fuse element formed between said first memory cell and said second memory cell in a sixth region of the first conductivity type; and a third selection transistor formed, in a seventh region of the second conductivity type, to have a conductivity type opposite to that of said third anti-fuse element, and connected to said third anti-fuse element so as to select said third anti-fuse element, and in said concomitantly programming said first anti-fuse element and said second anti-fuse element, a second voltage, at a potential different from that of a first voltage for turning on said first selection transistor and said second selection transistor, is applied to said fourth region and said fifth region, and said first voltage is applied to said seventh region.

15. The method of controlling a semiconductor memory device according to claim 13, wherein in said concomitantly programming said first anti-fuse element and said second anti-fuse element, the ground voltage is applied to said third region.

16. The method according to claim 12, wherein an insulating film is formed between said first region and said third region in a surficial portion of said substrate.

17. The method according to claim 12, wherein an insulating film is formed between said second region and said third region in a surficial portion of said substrate.

18. A semiconductor memory device comprising:
a substrate;
a first region formed in a surficial portion of said substrate and having a first conductivity type;
a second region formed in a surficial portion of said substrate and having said first conductivity type;
a first anti-fuse element composed of a transistor and formed in said first region;

a second anti-fuse element composed of a transistor and formed in said second region; and a third region having a second conductivity type opposite to said first conductivity type and formed between said first region and said second region in a surficial portion of said substrate so as to isolate said first region and said second region, wherein the third region is adjacent to both the first region and the second region.

19. The method according to claim 18, wherein an insulating film is formed between said first region and said third region in a surficial portion of said substrate and the insulating film is formed between said second region and said third region in a surficial portion of said substrate.

* * * * *

UNITED STATES PATENT AND TRADEMARK OFFICE
CERTIFICATE OF CORRECTION

PATENT NO. : 8,259,528 B2  
APPLICATION NO. : 12/892462  
DATED : September 4, 2012  
INVENTOR(S) : Noriaki Kodama et al.

Page 1 of 1

It is certified that error appears in the above-identified patent and that said Letters Patent is hereby corrected as shown below:

In the Specification

Col. 4, line 55: delete "$Tr_1$" and insert -- $Tr_3$ --

Col. 5, line 40: delete "$Tr_y$" and insert -- $Tr_5$ --

Col. 7, line 39: delete "$Tr_1$" and insert -- $Tr_3$ -- (2nd occurrence)

Col. 10, line 19: delete "$Tr_1$" and insert -- $Tr_3$ --

Signed and Sealed this  
Sixth Day of May, 2014

Michelle K. Lee  
*Deputy Director of the United States Patent and Trademark Office*